(12) United States Patent
Chen et al.

(10) Patent No.: US 7,440,272 B2
(45) Date of Patent: Oct. 21, 2008

(54) MOUNTING APPARATUS FOR DATA STORAGE DEVICE

(75) Inventors: Yun-Lung Chen, Taipei Hsien (TW); Qing-Hao Wu, Shenzhen (CN)

(73) Assignees: Hong Fu Jin Precision Industry (ShenZhen) Co., Ltd., ShenZhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/672,964

(22) Filed: Feb. 9, 2007

(65) Prior Publication Data

US 2008/0144274 A1 Jun. 19, 2008

(30) Foreign Application Priority Data

Dec. 15, 2006 (CN) .................. 2006 2 0016487

(51) Int. Cl.
*G06F 1/16* (2006.01)
(52) U.S. Cl. .................. 361/685; 312/223.2; 248/539; 174/60
(58) Field of Classification Search .......... 248/539, 248/205.1, 201, 68.1, 346.04; 174/50, 60; 211/175, 189, 194, 26; 312/223.2, 215, 211; 361/679–687, 724–727
See application file for complete search history.

(56) References Cited

U.S. PATENT DOCUMENTS

| 6,556,434 | B1 | 4/2003 | Chan et al. |
| 6,731,508 | B2 * | 5/2004 | Chen ................. 361/727 |
| 7,303,170 | B2 * | 12/2007 | Fan et al. ............ 248/27.3 |
| 2007/0297127 | A1 * | 12/2007 | Lau ................... 361/684 |

* cited by examiner

*Primary Examiner*—Hung V Duong
(74) *Attorney, Agent, or Firm*—Wei Te Chung

(57) ABSTRACT

A mounting apparatus for data storage device (50) with securing holes (52) defined therein, includes a base (20) and a pivot member (30) with one end pivotally attached to the base. The base includes at least a securing piece (241) corresponding to the securing hole of the data storage device and a clip (2231) protruded therefrom. The pivot member includes at least a securing piece (321) corresponding to the securing hole of the data storage device and an opening (343) corresponding to the clip. The clip of the base engages into the opening of the pivot member for mounting the data storage device when the pivot member rotates to a locked position. The clip of the base disengages from the opening of the flange panel of the pivot member when the pivot member rotates to an unlocked position.

19 Claims, 5 Drawing Sheets

MOUNTING APPARATUS FOR DATA STORAGE DEVICE

This application is related to a copending application, application Ser. No. 11/672,963, entitled with "MOUNTING DEVICE FOR DISK DRIVE", assigned to the same assignee.

BACKGROUND OF THE INVENTION

1. Field of the Invention

The present invention relates to mounting apparatuses, and more particularly to a mounting apparatus for a data storage device of a computer system.

2. Description of Related Art

A typical personal computer comprises data storage devices such as a hard disk drive (HDD), a floppy disk drive, and a compact disc read-only memory (CD-ROM) drive. Conventionally, the data storage devices are attached to a chassis of a computer enclosure using screws. A tool such as a screwdriver is required to fasten the screws when installing the data storage devices, and to unfasten the screws when removing the data storage devices. The operations are laborious and time-consuming. Furthermore, even careful operators may cause the tool to slip, or may drop screws. When this happens, other internal components of the computer may be damaged.

Nowadays, to allow convenient installation of a data storage device in a computer system, a pair of rails is typically provided. The rails are assembled to a pair of sidewalls of the data storage device, and then together inserted into a bracket of the computer system, between a pair of side plates of the bracket. However, the rails will increase space between the sidewalls of the data storage device and the side plates of the bracket, thereby reducing EMI-proofing (Electro Magnetic Interference, EMI) capability of the computer system.

What is needed, therefore, is a mounting apparatus with a simple structure for convenient installation and removal of a data storage device of a computer system.

SUMMARY OF THE INVENTION

A mounting apparatus for a data storage device with securing holes defined therein, includes a base and a pivot member pivotally attached to the base. The base includes a bottom panel and a first side panel with at least a securing piece corresponding to the securing hole of the data storage device extending therefrom, and a clip. A pivot post protrudes from the bottom panel of the base. The pivot member includes a flange panel and a second side panel with at least a securing piece corresponding to the securing hole of the data storage device extending therefrom, a pivot hole corresponding to the pivot post of the base, an opening corresponding to the clip of the base being defined in the flange panel, and at least a securing piece corresponding to the securing hole of the data storage device extending from the second side panel. The clip of the base engages into the opening of the pivot member when the pivot member rotates to a locked position, thus the data storage device is mountable between the first side panel and the second side panel. The clip of the base disengages from the opening of the flange panel of the pivot member when the pivot member rotates to an unlocked position.

Other advantages and novel features will be drawn from the following detailed description of preferred embodiments with attached drawings, in which:

DETAILED DESCRIPTION OF THE INVENTION

Figure 1:
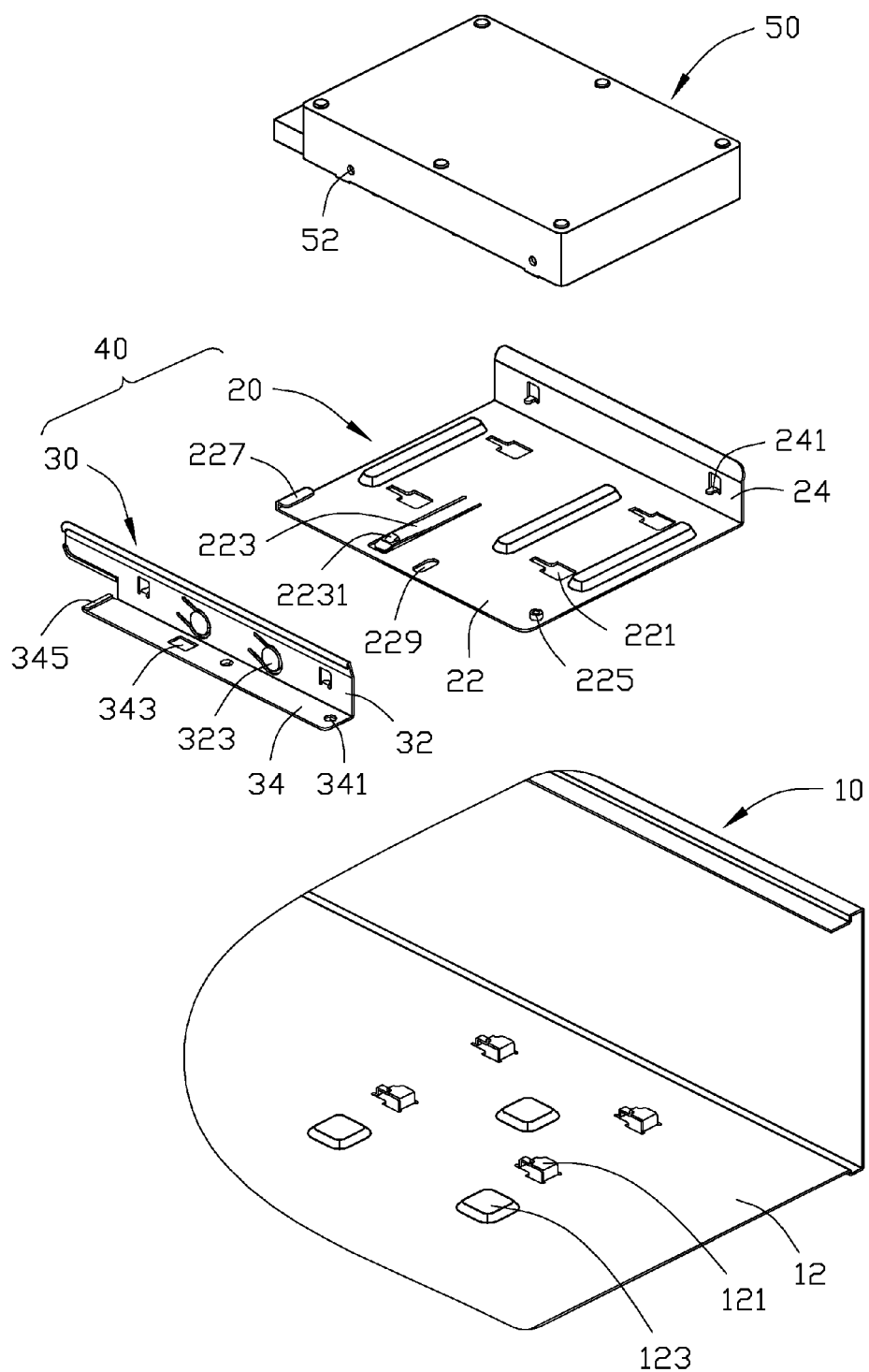
FIG. 1 is an exploded, isometric view of a mounting apparatus of a preferred embodiment of the present invention and a data storage device, the mounting apparatus including a chassis, and a mounting bracket consisting of a base, and a pivot member.

Referring to FIG. 1, a mounting apparatus of a preferred embodiment of the present invention is configured for securing a data storage device 50. A pair of securing holes 52 is defined in each of two sidewalls of the data storage device 50. In this preferred embodiment, the mounting apparatus includes a mounting bracket 40 for receiving the data storage device 50 therein, and a chassis 10 for accommodating the mounting bracket 40 and the data storage device 50 therein. The mounting bracket 40 includes a base 20 and a pivot member 30 pivotally attached to the base 20.

The chassis 10 includes a bottom panel 12 with a plurality of fixing portions 121 and bulges 123 extending upwardly therefrom.

The base 20 of the mounting bracket 40 includes a bottom panel 22 and a first side panel 24 perpendicularly extending from a side edge of the bottom panel 22. A plurality of T-shaped openings 221 corresponding to the fixing portions 121 are defined in the bottom panel 22 of the base 20, the openings 221 each include a bigger entrance portion and a smaller securing portion. A cantilever resilient piece 223 perpendicular to the first side panel 24 extends from a center portion of the bottom panel 22 to another side of the base 20. A clip 2231, such as a barb, is formed on a free end of the resilient piece 223. A height of the bulge 123 of the chassis 10 is higher than that of the clip 2231 of the resilient piece 223 of the base 20. A pivot post 225 protrudes upwardly from an edge away from the first side panel 24 near a corner of the bottom panel 22 of the base 20. An inverted L-shaped catch 227 extends upwardly from the edge at an opposite corner of the bottom panel 22 of the base 20. A short arc-shaped slot 229 is defined in the bottom panel 22 of the base 20 between the catch 227 and the post 225. A center of the arc-shaped slot 229 is a same distance from the edge as the pivot post 225 of the base 20. A pair of securing pieces 241 corresponding to the securing holes 52 of one side of the data storage device 50 extends perpendicularly inward from the first side panel 24.

Figure 2:
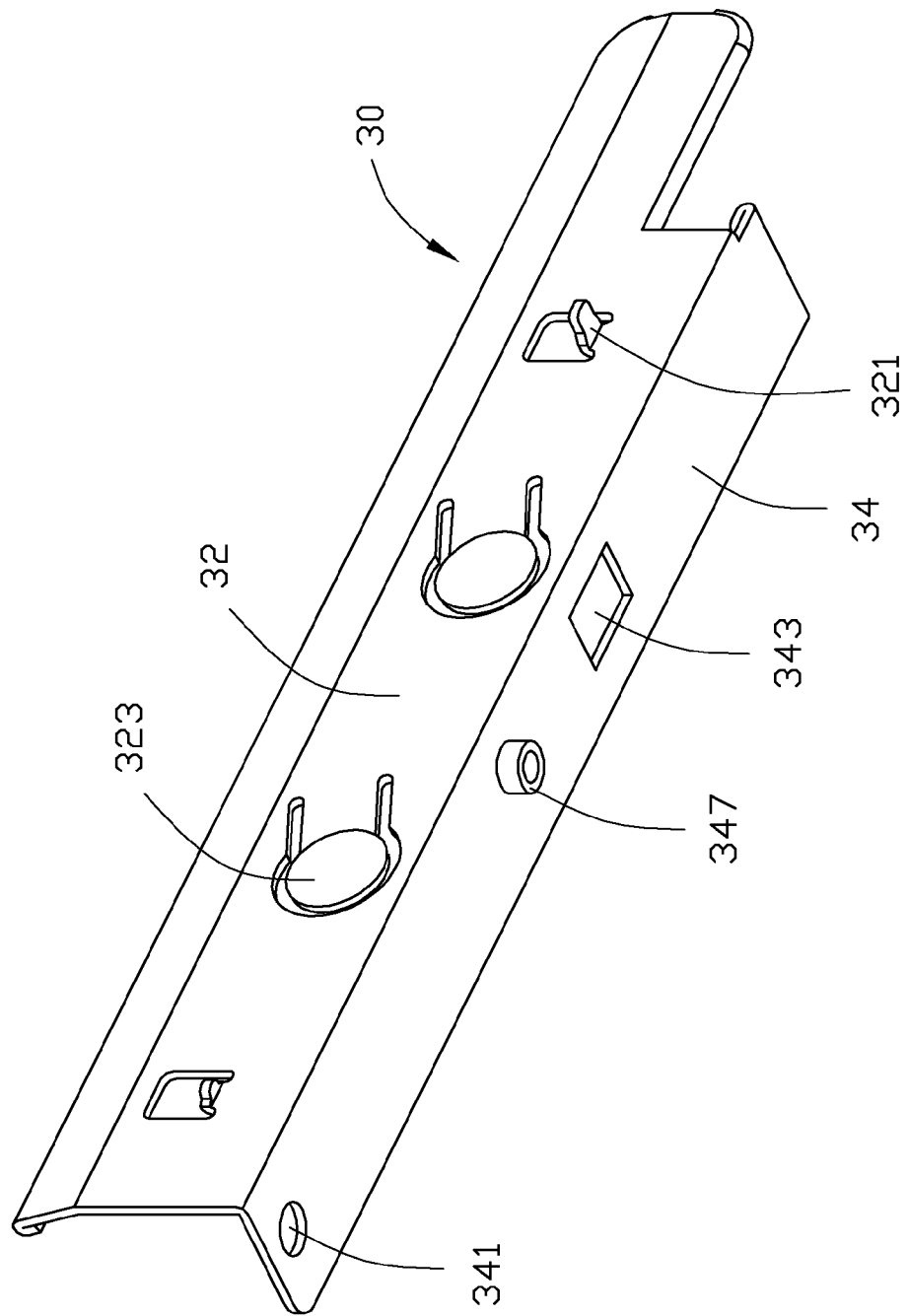
FIG. 2 is an isometric, enlarged view of the pivot member, but viewed from another aspect.

Referring also to FIG. 2, the pivot member 30 of the mounting bracket 40 includes a second panel 32 and a flange panel 34 extending perpendicularly out from a bottom edge of the second panel 32. A pair of securing pieces 321 corresponding to the securing holes 52 of another side of the data storage device 50 extends perpendicularly inward from the second side panel 32. A pair of anti-EMI plates 323 is formed in the second side panel 32 between the securing pieces 321. A pivot hole 341 corresponding to the pivot post 225 of the base 20 is defined in one end of the flange panel 34. A guiding post 347 corresponding to the arc-shaped slot 229 extends down from a bottom side of the flange panel 34. A rectangular opening 343 corresponding to the clip 2231 is defined in the flange panel near the guiding post 347. A rolled portion 345 is formed at another end of the flange panel 34.

Figure 3:
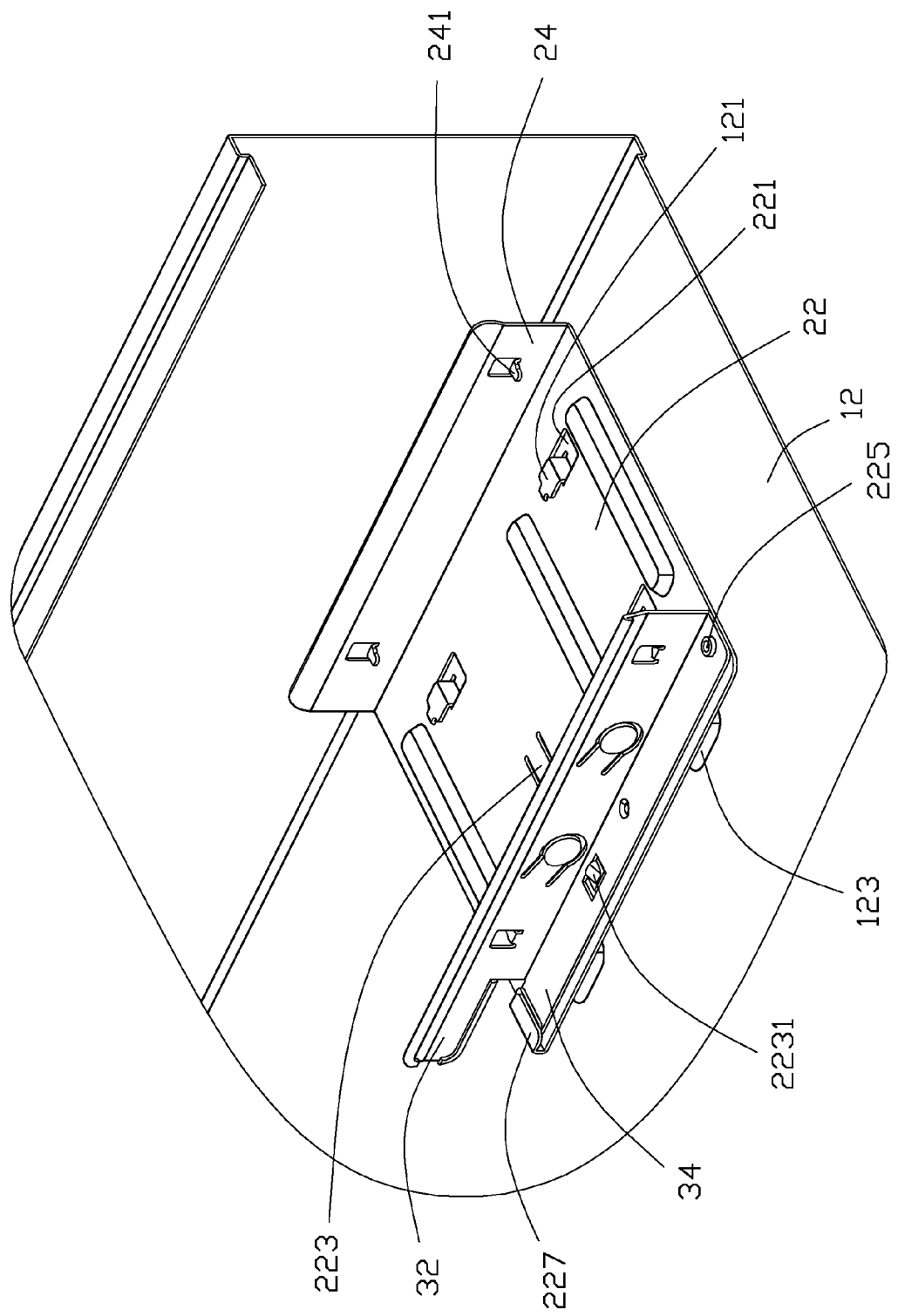
FIG. 3 is an assembled view of the mounting bracket and the chassis in FIG. 1.
Figure 4:
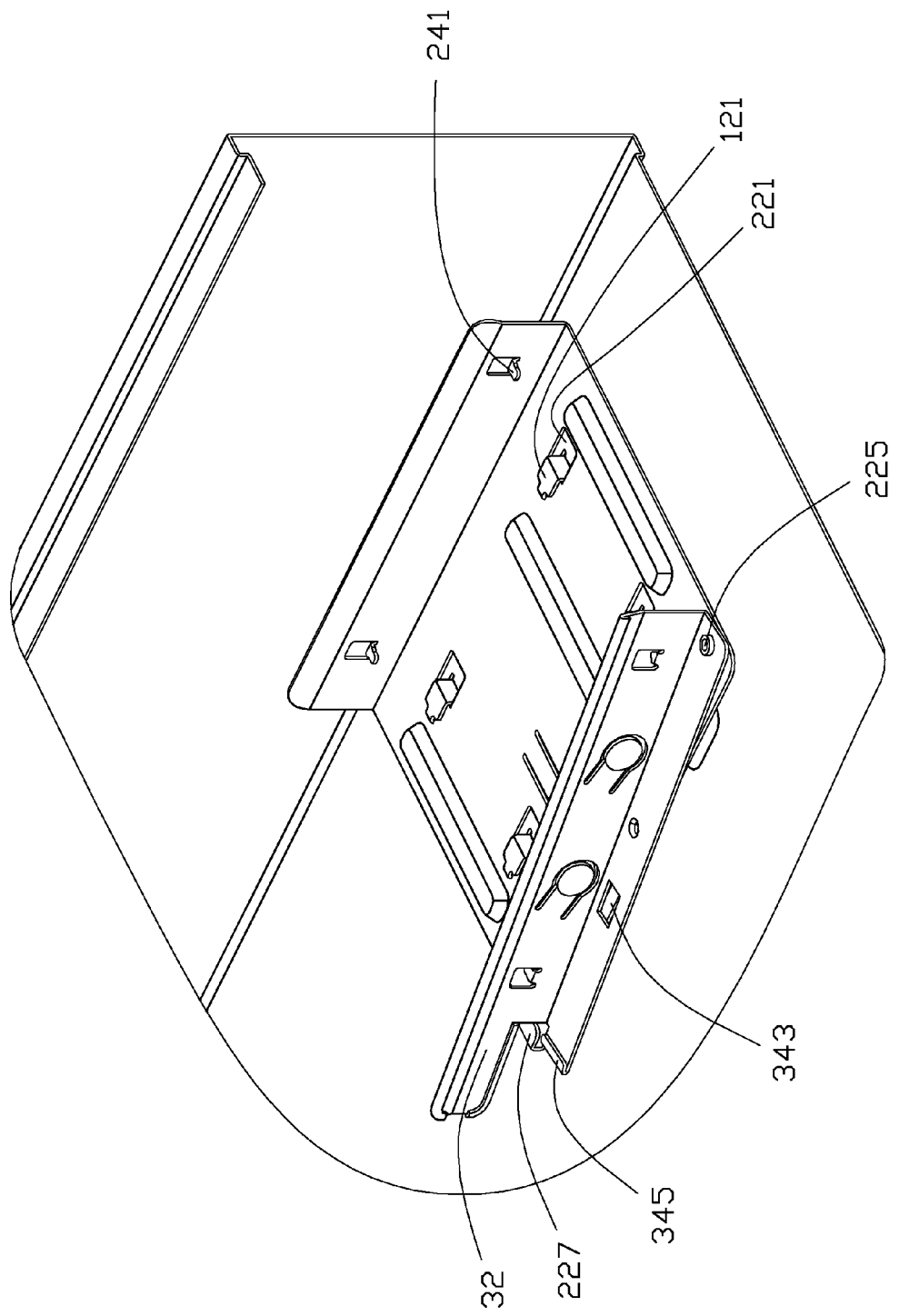
FIG. 4 is similar to FIG. 3 but with the pivot member rotated to an unlocked position.
Figure 5:
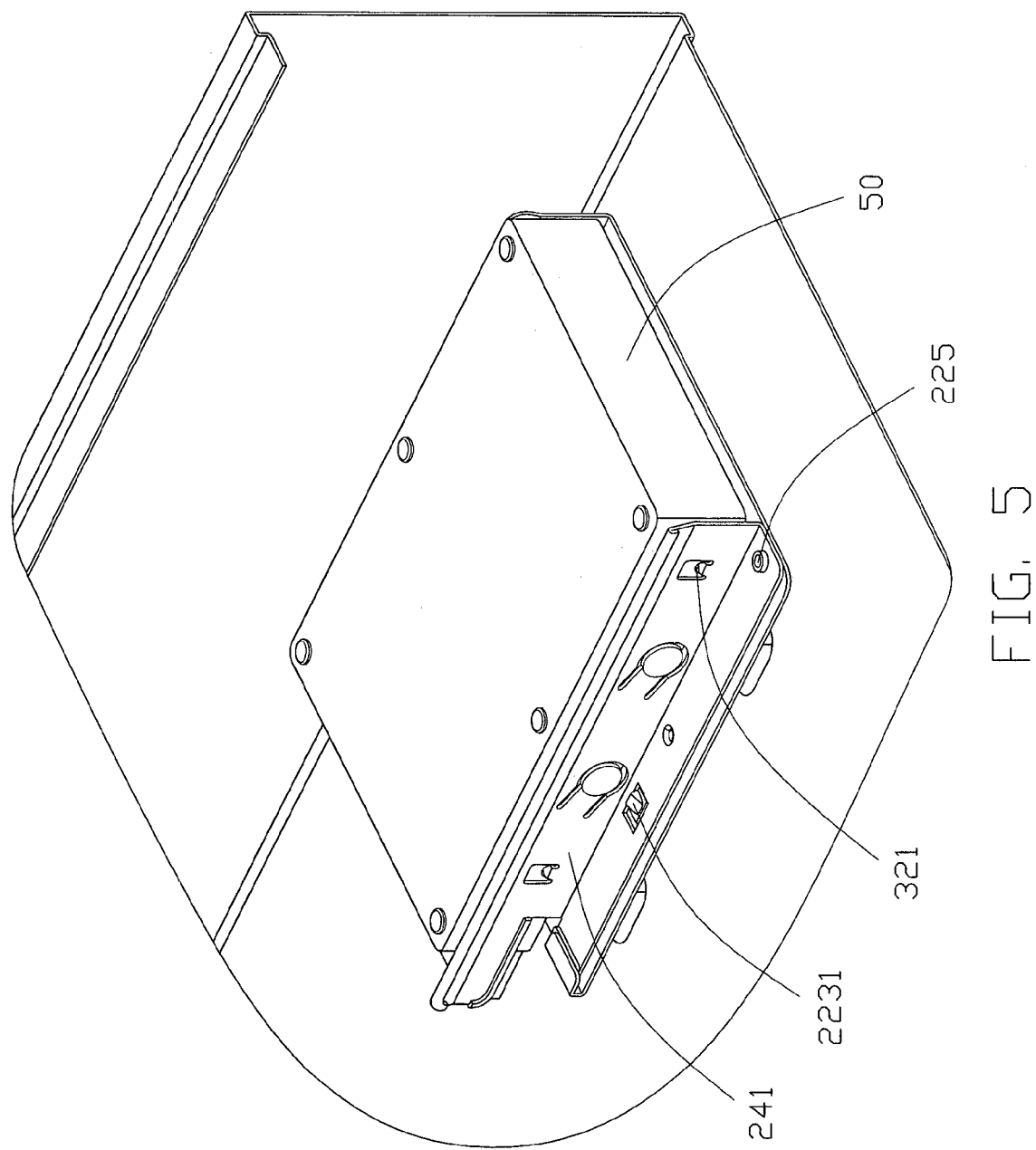
FIG. 5 is an assembled view of FIG. 1.

Referring also to FIG. 3-FIG. 5, in assembling, the fixing portions 121 are extended through the corresponding entrance portions of the openings 221 of the base 20, then the base 20 is pushed or pulled to slide in a direction parallel to the bottom panel 12 of the chassis 10 until the fixing portions 121 engage with the securing portions of the openings 221. The bulges 123 of the chassis 10 resist against a bottom side of the bottom panel 22 of the base 20. An interspace is configured between the bottom panel 12 of the chassis 10 and the bottom panel 22 of the base 20 for allowing the free end of the resilient piece 223 to deform downwardly freely. The data storage device 50 is placed on the bottom panel 22 with the securing pieces 241 of the first side panel 24 inserted into the corresponding securing holes 52 of the data storage device 50. The pivot post 225 of the base 20 extends through the pivot hole 341 of the pivot member 30 and the guiding post 347 extends through an outer end of the arc-shaped slot 229 of the base 20. The pivot member 30 rotates clockwise to a locked position where the clip 2231 of the resilient piece 223 of the base 10 engages within the rectangular opening 343 of the pivot member 30 and the rolled portion 345 is firmly caught by the catch 227. The guiding post 347 slides to an inner end of the arc-shaped slot 229 of the base. Thus the pivot member 30 is attached to the side opposite to the first side panel 24 of the base 20. At the same time, the securing pieces 321 are inserted into the corresponding securing holes 52 of the data storage device 50 for securing the data storage device 50 between the first side panel 24 and the second side panel 32.

In removing the data storage device 50 from the mounting bracket 40, the clip 2231 of the resilient piece 223 is pressed down into the interspace between the base 20 and the chassis 10, the pivot member 30 rotates anticlockwise to an unlocked position where the clip 2231 of the base disengages from the opening 343 of the pivot panel 30 and the securing pieces 341 disengage from the securing holes 52 of the data storage device 50, then the data storage device 50 is moved out from the mounting bracket 10.

It is to be understood, however, that even though numerous characteristics and advantages have been set forth in the foregoing description of preferred embodiments, together with details of the structures and functions of the preferred embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A mounting assembly, comprising:
   a base comprising a bottom panel and a first side panel extending from one side of the bottom panel, the bottom panel comprising a pivot post extending therefrom and a resilient piece with a free end, a clip being formed on the free end;
   a pivot member pivotally attached to the base comprising a second side panel and a flange panel, a pivot hole corresponding to the pivot post of the base and an opening corresponding to the clip being defined in the flange panel; and
   a data storage device mounted between the first side panel of the base and the second side panel of the pivot member after the pivot member rotates to a locked position with the clip of the resilient piece engaging in the opening of the pivot member.

2. The mounting assembly as described in claim 1, wherein at least a pair of securing holes is respectively defined in opposite sides of the data storage device, and at least a pair of opposite securing pieces extends respectively from the first side panel of the base and the second side panel of the pivot member for inserting into the respective securing holes to thereby secure the data storage device between of the first and second side panels.

3. The mounting assembly as described in claim 1, wherein an arc-shaped slot is defined in the bottom panel of the base, and a guiding post capable of sliding along the arc-shaped slot extends down from the flange panel of the pivot member.

4. The mounting assembly as described in claim 3, wherein the guiding post slides to an inner end of the arc-shaped slot when the pivot member rotates to the locked position and to an outer end of the arc-shaped slot when the pivot member rotates to an unlocked position where the clip of the resilient piece is disengaged from the opening of the pivot member.

5. The mounting assembly as described in claim 1, wherein the base further comprises a catch extending from the bottom panel thereof, a rolled portion caught by the catch extends from an end edge of the flange panel of the pivot member.

6. The mounting assembly as described in claim 1, wherein the resilient piece is perpendicular to the side panel of the pivot member when the pivot member is in the locked position and is deformable in a direction perpendicular to the bottom panel of the base.

7. The mounting assembly as described in claim 1, further comprising a chassis for accommodating the base, the pivot member, and the data storage device therein, wherein an interspace is configured between the bottom panel of the base and the chassis for allowing the free end of the resilient piece deforming down freely.

8. A mounting apparatus for a data storage device with securing holes defined therein, comprising:
   a base comprising a bottom panel with a clip protruding therefrom and a first side panel with at least a securing piece corresponding to at least one of the securing holes of the data storage device extending therefrom; and
   a pivot member with one end pivotally attached to the bottom panel of the base, comprising a second side panel and a flange panel connecting with the second side panel, an opening corresponding to the clip being defined in the flange panel, at least a securing piece corresponding to at least one of the securing holes of the data storage device extending from the second side panel;
   wherein the pivot member is capable of being rotated relative to the base to deform the clip, and the clip rebounds to engage in the opening of the pivot member when the pivot member rides over the clip and rotates to a locked position.

9. The mounting apparatus as described in claim 8, wherein a pivot hole is defined in the flange panel of the pivot member, and a pivot post extending through the pivot hole protrudes upwardly from the bottom panel of the base.

10. The mounting apparatus as described in claim 9, wherein an arc-shaped slot is defined in the bottom panel of the base, and a guiding post capable of sliding along the arc-shaped slot extends from the flange panel of the pivot member.

11. The mounting apparatus as described in claim 10, wherein the guiding post slides to one end of the slot when the pivot member rotates to the locked position and to another end of the slot when the pivot member rotates to an unlocked position.

12. The mounting apparatus as described in claim 10, wherein the pivot hole is defined in one end of the flange panel of the pivot member, a rolled portion is formed at an opposite end of the flange panel of the pivot member, and a catch corresponding to the rolled portion is formed on the bottom panel of the base.

13. The mounting apparatus as described in claim 12, wherein the rolled portion engages with the catch in a direction perpendicular to the flange panel when the pivot member rotates to the locked position and disengages from the catch when the pivot member rotates to the unlocked position.

14. The mounting apparatus as described in claim 8, wherein a resilient piece with a free end is formed in the bottom panel of the base, and the clip is formed on the free end of the resilient piece.

15. A mounting assembly comprising:
   a chassis;
   a base attached within the chassis, the base comprising a bottom panel and a first side panel extending from one side of the bottom panel, the bottom panel comprising a resilient piece with a clip formed thereon, the resilient piece being deformable in a direction perpendicular to the bottom panel;
   a data storage device mounted in the base; and
   a pivot member pivotally attached to an opposite side of the bottom panel of the base, the pivot member comprising a flange panel and a second side panel extending from the flange panel, an opening corresponding to the clip being defined in the flange panel; wherein
   the pivot member is capable of rotating relative to the base in a plane parallel to the bottom panel to deform the clip in the direction perpendicular to the bottom panel, and the clip is capable of rebounding to engage with the pivot member in the opening when the pivot member rides over the clip such that the first side panel and the second side sandwich the data storage device therebetween.

16. The mounting assembly as claimed in claim 15, wherein one end of the flange panel is pivotably connected with the bottom panel of the base, and an opposite end of the flange panel is catched by a catch formed at the bottom panel of the base in the direction perpendicular to the bottom panel when the clip engages with the pivot member in the opening.

17. The mounting assembly as claimed in claim 16, wherein the clip comprises a barb engagable with the pivot member in the opening to lock the pivot member to the base in a direction parallel to the bottom panel of the base.

18. The mounting assembly as claimed in claim 17, wherein a pivot post is formed at one of the bottom panel of the base and the flange panel of the pivot member, and a pivot hole is defined in the other one of the bottom panel of the base and the flange panel of the pivot member for pivotably receiving the post therein.

19. The mounting assembly as claimed in claim 17, wherein a guiding slot is defined in one of the bottom panel of the base and the flange panel of the pivot member, and a guiding post is formed at the other one of the bottom panel of the base and the flange panel of the pivot member, the guiding post being received in the guiding slot and sliding along the guiding slot when the pivot member rotates relative to the base.

* * * * *